(12) United States Patent
Zhang

(10) Patent No.: US 7,396,248 B2
(45) Date of Patent: Jul. 8, 2008

(54) LAND GRID ARRAY CONNECTOR WITH LATCH PORTION

(75) Inventor: Jie-Feng Zhang, ShenZhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/900,884

(22) Filed: Sep. 13, 2007

(65) Prior Publication Data

US 2008/0064230 A1    Mar. 13, 2008

(51) Int. Cl.
*H01R 13/62* (2006.01)
(52) U.S. Cl. .................................................. 439/331
(58) Field of Classification Search ............... 439/331, 439/342, 341
See application file for complete search history.

(56) References Cited

U.S. PATENT DOCUMENTS

| | | | |
|---|---|---|---|
| 6,648,664 B1 * | 11/2003 | McHugh et al. | 439/331 |
| 6,685,494 B1 * | 2/2004 | McHugh et al. | 439/342 |
| 7,179,092 B2 | 2/2007 | Ma et al. | |
| 7,247,043 B2 * | 7/2007 | Lai | 439/331 |

* cited by examiner

*Primary Examiner*—Phuong K Dinh
(74) *Attorney, Agent, or Firm*—Wei Te Chung

(57) ABSTRACT

An LGA connector (1) includes an housing (2), a stiffener (3) surrounding the housing, a clip (5) pivotably engaged the stiffener, and a lever (4) engaged with the stiffener for pressing the clip. The housing has a supporting portion (21) and a mounting portion (22) having four mating faces surrounding the supporting portion. Each mating face includes at least one spring latch (24) extending outwardly therefrom and a cavity (241) defined on the spring latch for engaging with the stiffener.

1 Claim, 5 Drawing Sheets

LAND GRID ARRAY CONNECTOR WITH LATCH PORTION

BACKGROUND OF THE INVENTION

1. Field of the Invention

The present invention is directed to an art of a land grid array (LGA) connector for electrically bridging two electrical interfaces such as a printed circuit board (PCB) and a central processing unit (CPU).

2. Description of Prior Arts

U.S. Pat. No. 7,179,092 issued on Feb. 20, 2007 discloses a plurality of LGA socket contacts for electrically connecting a Land Grid Package (LGP) to a printed circuit board (PCB). The LGA connector includes a housing, a number of terminals secured on the housing, a stiffener defining a middle window for receiving the housing, a clip pivotably engaged on one end of the stiffener, and a lever coupled with another end of the stiffener for fastening the clip onto the housing and having an operation lever and a mounting lever. The housing comprises a supporting portion for supporting the LGP, a mounting portion received in the window of the stiffener and a plurality of protrusions extending from two opposite sides of the mounting portion for engaging with corresponding recesses defined at two opposite edges of the window. The stiffener further has a latch extending outside from one side wall for engaging with the lever.

In use, the housing is retained in the window by the interference between the protrusions of the housing and the recesses of the stiffener. The operation lever is rotated to a horizontal position and locked by the latch of the stiffener. Considerably, the stiffener is given an upward force by the lever. The stiffener is limited rigid, and opposite ends of the stiffener tend to bend upward. At the time, the corresponding ends of the housing are prone to bend upward alone with the bended end of the stiffener. That is, the engagement between the stiffener and the housing is unreliable. Additionally, When the stiffener is designed smaller to enhance the engagement between the stiffener and the housing, the stiffener is easy to have a distortion by the engagement.

Hence, it is desirable to provide an improved land grid array connector to overcome the aforementioned disadvantages.

SUMMARY OF THE INVENTION

An object of the present invention is to provide an LGA connector that can firmly retain a housing into a window of a stiffener.

To achieve the above object, a land grid array connector for connecting a land grid package to a printed circuit board. The land grid array comprises a stiffener defining a window thereon, a housing including a supporting portion for coupling with the land grid package and a mounting portion received in the window of the stiffener, a plurality of contacts mounted to the supporting portion of the housing, a clip pivotably engaging with one side wall of the stiffener and a lever coupling with the stiffener for pressing the clip. The housing further has four mating faces surrounding the supporting portion. Each mating face comprises at least one spring latch extending outwardly therefrom and a cavity defined on the spring latch for engaging with the stiffener. The cavities will avoid the housing from shaking up and down. Thus, even if two ends of the stiffener bend, the cavities will avoid the housing from distorting alone with the stiffener.

Advantages of the present invention are to provide a housing having a spring latch and a cavity defined on the spring latch. During assembly, a side wall of the stiffener is retained in the cavity, at that time, the spring latch resists against the side wall resiliently. That is, the housing is firmly retained in the middle window of the stiffener. It is noted that above mentioned engagement between the housing and the stiffener is so resilient that doesn't require that housing have excellent precision for coupling with the window.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Figure 1:
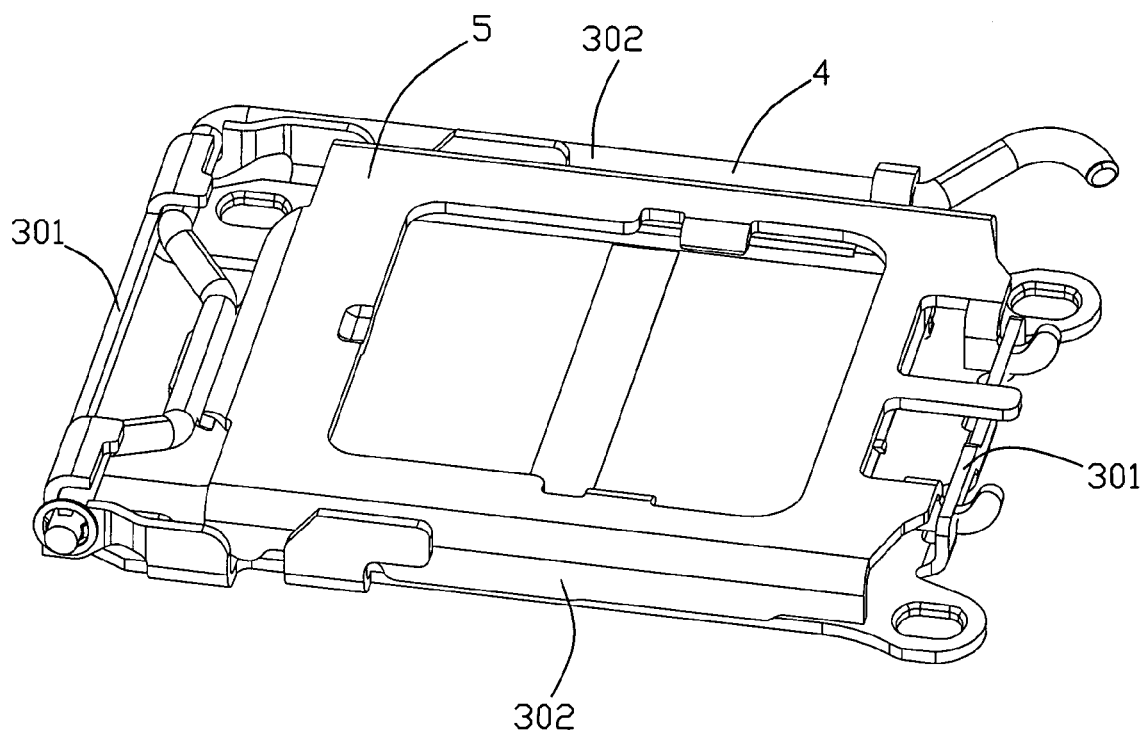
FIG. 1 is an assembled perspective view of a land grid array connector of the present invention.
Figure 2:
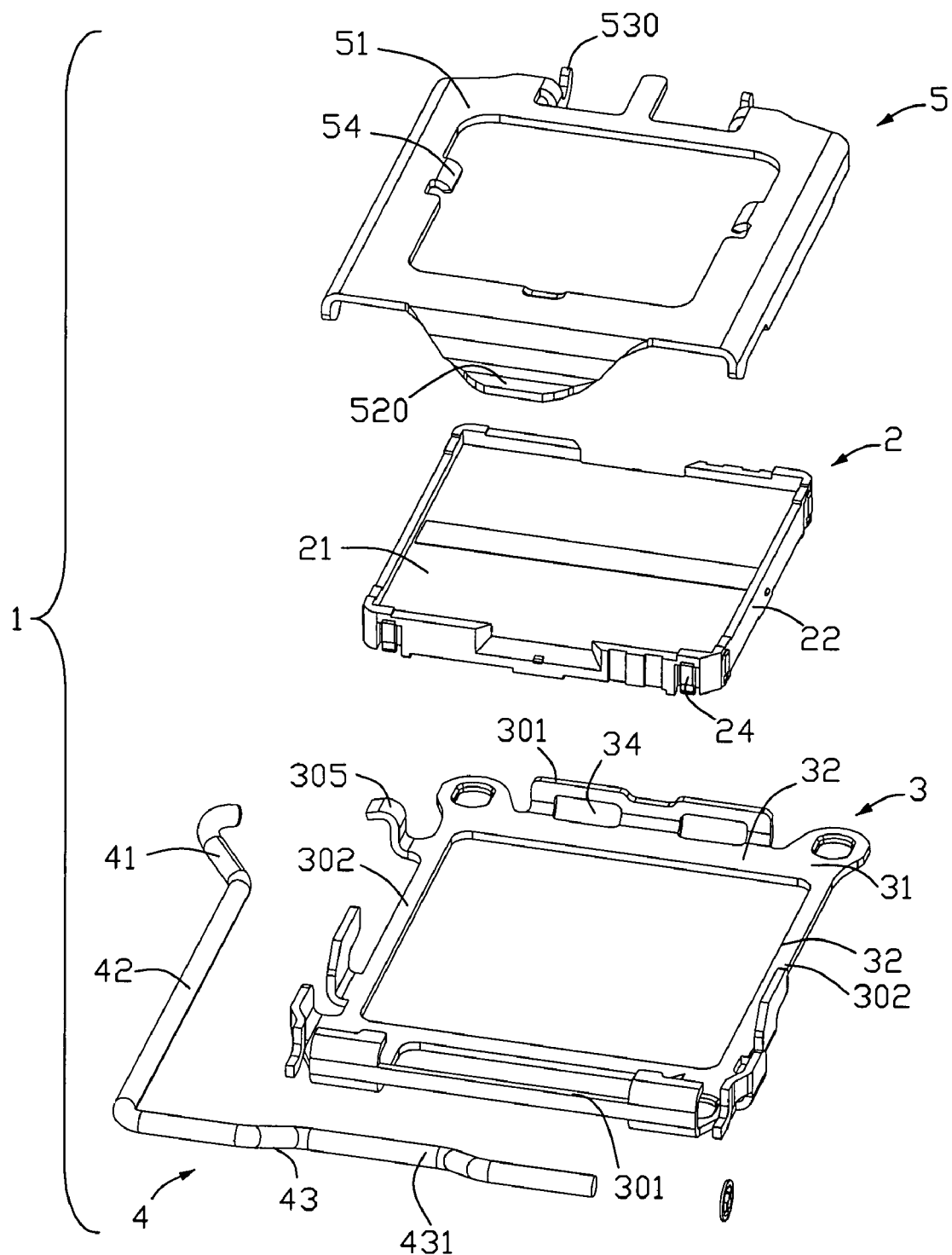
FIG. 2 is an exploded view of the land grid array connector as shown in FIG. 1.
Figure 3:
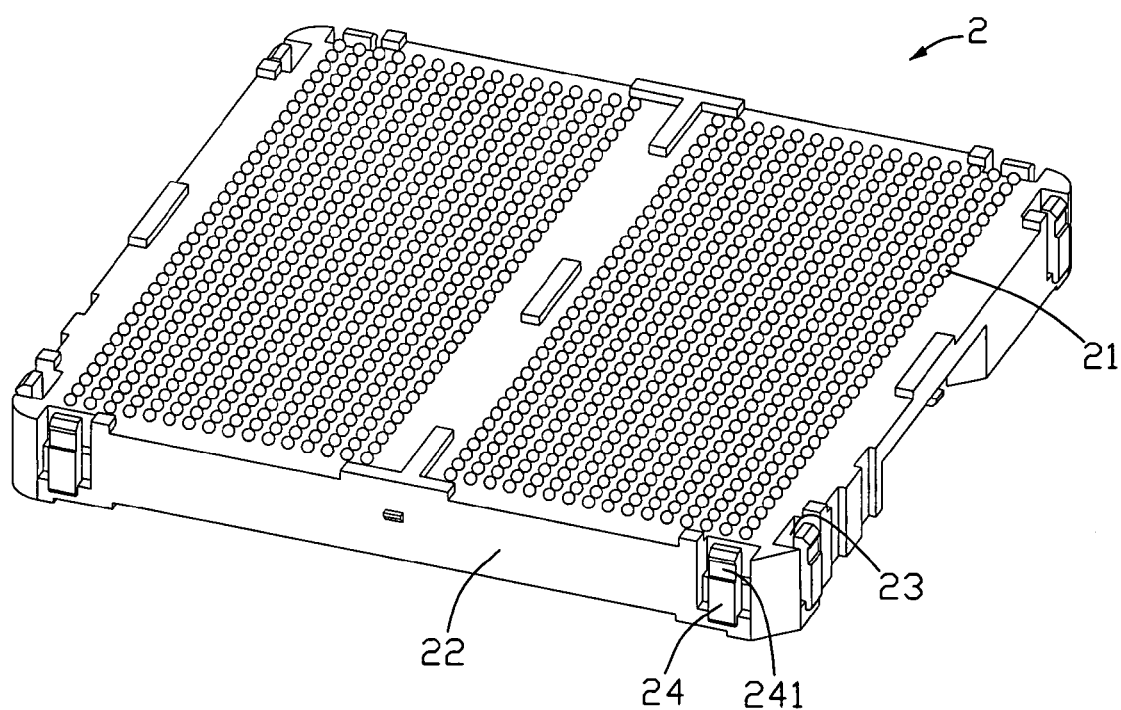
FIG. 3 is a magnify view of a housing of the land grid array connector.
Figure 4:
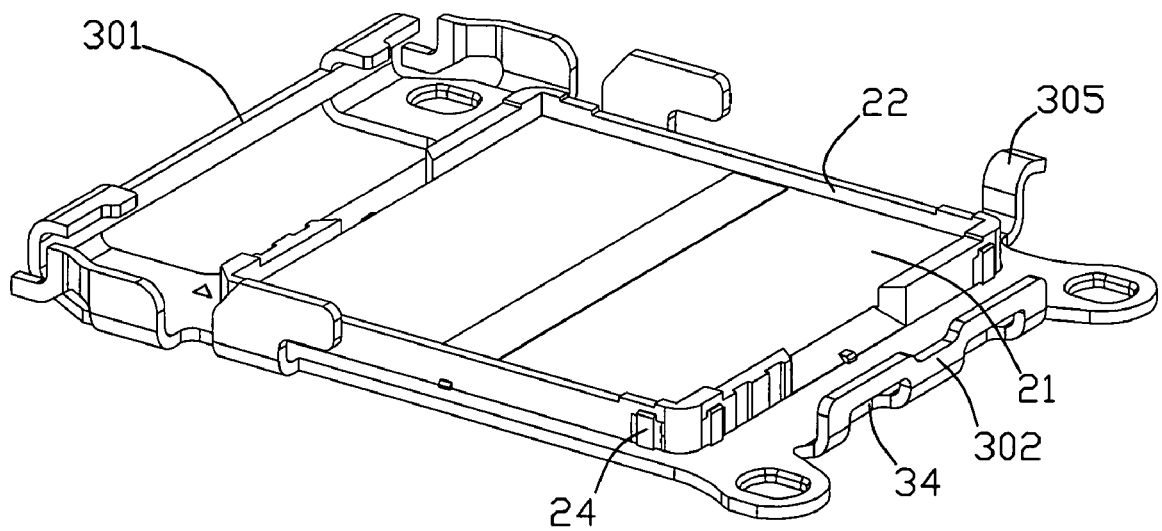
FIG. 4 is a perspective view of the housing assembled to a stiffener.
Figure 5:
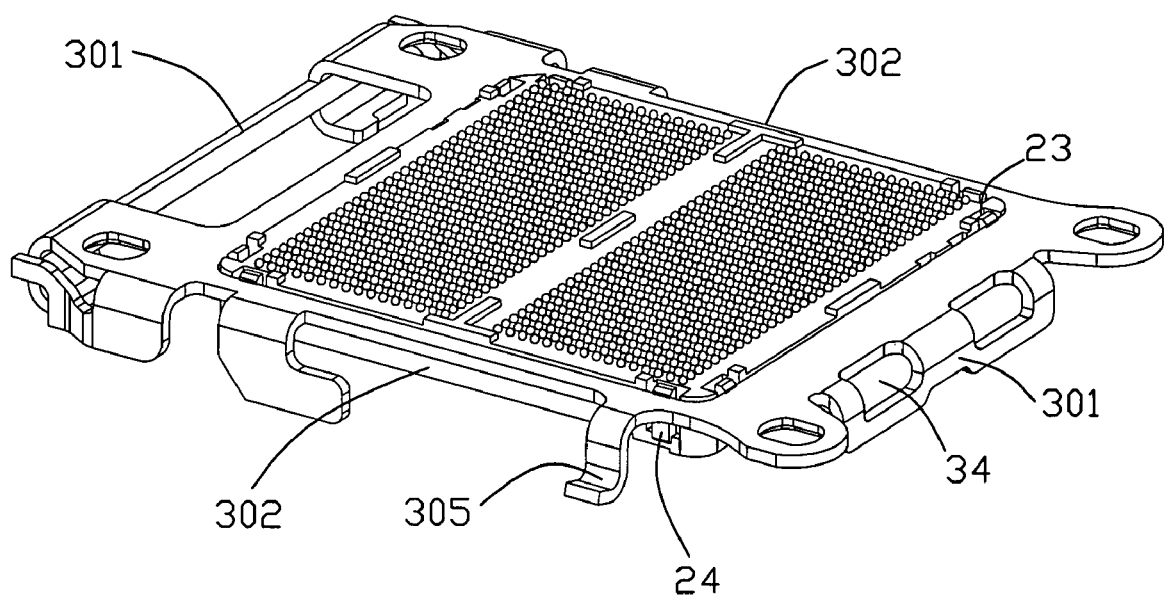
FIG. 5 is another perspective view similar to FIG. 1, with a lever being removed.

Reference will now be made to the drawing figures to describe the present invention in detail. Referring to FIGS. 1-5, a land grid array connector 1 in accordance with the embodiment of the present invention comprises a housing 2 mounted on a printed circuit board (not shown), a stiffener 3 engaging with the housing 2, a metal clip 5 pivotably engaged on one end of the stiffener 3, and a lever 4 engaged on another end of the stiffener 3 for fastening the clip 5 onto the housing 2. A Land Grid Package (LGP) (not shown) is ready to be disposed between the housing 2 and the clip 5, for connecting with the printed circuit board via the connector 1.

The housing 2 is of rectangular configuration. A plurality of passageways (not labeled) are defined in the housing 2 for receiving a corresponding number of electrical contacts (not labeled) therein. The housing 2 comprises a supporting portion 21 and a mounting portion 22 integrally connecting with the supporting portion 21. The mounting portion 22 has four mating faces surrounding the supporting portion 21. Each mating face has two spring latches 24 extending outwardly therefrom and disposed at opposite ends thereof. Each mating face of the housing 2 further has one receiving space 23 defined thereon for receiving the spring latch 24. The spring latch 24 extends from the mating face of the housing 2 and beyond the receiving space 23 for resisting against the stiffener 3 and has a corresponding cavity 241 defined thereon for engaging with the stiffener 3.

The stiffener 3 comprises a bottom wall 31 and four side walls 32 extending upwardly from the bottom wall 31. The bottom wall 31 defines a middle window (not labeled) for receiving the mounting portion 22 of the housing 2. The side walls 32 include a pair of opposite first side walls 301 and a pair of opposite second side walls 302. One of the first side walls 301 is of U-shaped configuration for coupling with the lever 4 and the opposite first side wall 301 has a pair of pivotal holes 34 defined thereon for mating with the metal clip. 5. One of the second side walls 302 has a latch 305 extending outside therefrom for engaging with the lever 4.

The clip 5 comprises a substantially rectangular main plate 51 defining a middle window (not labeled), a pair of hooks 530 extending from a rear side of the main plate 51, a projecting portion 520 extending from a front side of the main plate 51. A pair of clasping portions 54 bend inwardly for pressing the LGP. The hook 530 is pivotably mounted in the pivotal holes 34.

The lever 4 comprises a locking portion 41 for engaging with the latch 305 of the stiffener 3, an operation lever 42 and a mounting lever 43 perpendicular to the operation lever 42. The mounting lever 43 rotates in a recess (not labeled) defined between the U-shaped first wall 301 of the stiffener 3 and the bottom wall 31. The lever 4 further has a middle pressing portion 431 pressing the projecting portion 520 of the clip 5.

In assembly, firstly, the housing 2 is mounted into the window of the stiffener 3, at this time, edge portions of the side walls 32 of the stiffener 3 are retained in the cavity 241 for avoiding from shaking up and down. The spring latch 24 resists against the side wall 32 resiliently. That is, the housing 2 is firmly resiliently retained in the middle window of the stiffener 3. Secondly, the lever 4 and the clip 5 are assembled to the stiffener 3. Finally, the connector 1 is soldered to the printed circuit board. In use of the connector 1, the clip is rotated upwardly to a perpendicular position and then the LGP is disposed onto the housing 2. The middle pressing portion 431 of the lever 4 presses the projecting portion 520 of the clip 5 and the clip 5 is then rotated downwardly to a horizontal closed position. At last, the locking portion 41 firmly engages with the latch 305 of the stiffener 3. When the lever 4 is actuated to press the projecting portion 520 of the clip 5 and the locking portion 41 of the lever 4 is locked by the latch 305 of the stiffener 3, the clip 5 depresses the LGP downwardly. The LGP is electrically connecting with the printed circuit board by the number of electrical contacts mounted in the housing 2.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A land grid array connector for connecting a land grid package to a printed circuit board, comprising:
   a stiffener comprising a bottom plate and a plurality of side walls extending upwardly from the bottom plate, the bottom plate defining a window;
   a housing comprising a support portion and a mounting portion received in the window of the stiffener and having four mating faces surrounding the supporting portion, each mating face comprising at least one spring latch extending outwardly therefrom and a cavity defined on the spring latch for engaging with the stiffener;
   a plurality of contacts mounted to the supporting portion of the housing;
   a clip pivotably engaging with one side wall of the stiffener; and
   a lever coupling with the stiffener for pressing the clip wherein discloses said the clip has a plurality of hooks extending from a rear side thereof for engaging with the stiffener and wherein each mating face of the housing has at least one receiving space defined thereon for receiving the spring latch and wherein discloses said spring latch extends from the mating face of the housing and beyond the receiving space for resisting against the side wall of the stiffener.

* * * * *